US012707862B2

(12) United States Patent
Peng

(10) Patent No.: US 12,707,862 B2
(45) Date of Patent: Aug. 11, 2026

(54) DISPLAY PANELS AND DISPLAY DEVICES

(71) Applicant: WUHAN CHINA STAR OPTOELECTRONICS SEMICONDUCTOR DISPLAY TECHNOLOGY CO., LTD., Wuhan (CN)

(72) Inventor: Simin Peng, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 386 days.

(21) Appl. No.: 18/291,568

(22) PCT Filed: Nov. 21, 2023

(86) PCT No.: PCT/CN2023/132795

§ 371 (c)(1),
(2) Date: Jan. 23, 2024

(87) PCT Pub. No.: WO2025/102406

PCT Pub. Date: May 22, 2025

(65) Prior Publication Data

US 2025/0228105 A1 Jul. 10, 2025

(30) Foreign Application Priority Data

Nov. 16, 2023 (CN) ......................... 202311544501.1

(51) Int. Cl.
*H10K 59/80* (2023.01)
*H10K 59/122* (2023.01)
*H10K 59/131* (2023.01)

(52) U.S. Cl.
CPC ......... *H10K 59/873* (2023.02); *H10K 59/122* (2023.02); *H10K 59/131* (2023.02); *H10K 59/80521* (2023.02)

(58) Field of Classification Search
None
See application file for complete search history.

(56) References Cited

U.S. PATENT DOCUMENTS 12,484,421 B2 * 11/2025 Lee ...................... H10K 59/124
2025/0241175 A1 * 7/2025 Ahn ..................... H10K 59/873
2026/0020476 A1 * 1/2026 Sun .................... H10K 59/1213

FOREIGN PATENT DOCUMENTS

CN 218160441 U 12/2022
CN 116156934 A 5/2023
(Continued)

OTHER PUBLICATIONS

International Search Report in International application No. PCT/CN2023/132795, mailed on May 22, 2024.
(Continued)

*Primary Examiner* — Bradley Smith
(74) *Attorney, Agent, or Firm* — PV IP PC; Wei Te Chung

(57) ABSTRACT

The present application provides a display panel and a display device. The display panel comprises a substrate, a dam, a first metal partition structure, a common layer and a cathode. The side surface of the first metal partition structure close to a hole area is provided with a recessed first undercut structure, so as not only to prevent water vapor from laterally invading a display area via the common layer, but also to avoid electrochemical corrosion due to a conductive path formed by the charged cathode overlapping the first metal partition structure.

20 Claims, 4 Drawing Sheets

(56) References Cited

FOREIGN PATENT DOCUMENTS

| | | | |
|---|---|---|---|
| CN | 116916690 | A | 10/2023 |
| CN | 117642025 | A | 3/2024 |

OTHER PUBLICATIONS

Written Opinion of the International Search Authority in International application No. PCT/CN2023/132795,mailed on May 22, 2024.

* cited by examiner

DISPLAY PANELS AND DISPLAY DEVICES

CROSS-REFERENCE TO RELATED APPLICATION

This application is a national stage of International Application No. PCT/CN2023/132795, filed on Nov. 21, 2023, which claims priority to Chinese Patent Application No. 202311544501.1, filed on Nov. 16, 2023. The aforementioned applications are herein incorporated by references in their entireties.

TECHNICAL FIELD

The present disclosure relates to the field of display technologies, and in particular, to display panels and display devices.

BACKGROUND

Compared with traditional rigid display panels, flexible organic light-emitting diode (OLED) display panels have advantages of self-illumination, wide viewing angles, high contrast, low power consumption, and extremely high response speed. OLED luminescent material is an organic material that is extremely sensitive to water and oxygen. A flexible OLED display panel generally adopting thin film encapsulation (TFE) technology includes an encapsulation layer that is generally a multi-layer structure having an inorganic film, an organic film, and another inorganic film stacked in sequence. A water vapor transmittance rate (WVTR) of the encapsulation layer is about $10^{-6}$ g/m$^2$·day, which ensures the normal operation of the OLED luminescent material.

Currently, camera under-panel OLED display panels require digging holes in the panel to place the camera. In order to ensure packaging performance of the digging area, a portion of a common layer in this area needs to be separated from another portion of the common layer in a display area to avoid lateral intrusion of water vapor through the common layer, and then this area is encapsulated through thin film packaging to ensure the packaging performance of the digging area and extend the service life of the product. A metal partition structure is side etched to form a segment difference in a transition area, so that the common layer is cut off at this position to form a discontinuous common layer, which make external water vapor cannot invade the display area through the common layer. However, a cathode above the common layer will also be cut off at the metal partition structure. The cathode is a metal layer mixed with Mg/Ag. After the cathode is cut off at the metal partition structure, it overlaps with a middle metal Al of the metal partition structure to form a circuit conduction. During a reliability test, water vapor and $K^+$ in a polarizer enter an interface of the common layer, at the same time, the disconnected cathode overlaps with the middle metal Al of the metal partition structure, the middle metal Al is conductive to the whole cathode in the display area and transmits a negative voltage to form electrochemical corrosion cathode. The water vapor generates $OH^-$ ions under the action of electrons, which reacts with an inorganic film of an encapsulation layer to generate $K_2SiO_3$, which dissolves in an aqueous solution, destroying the encapsulation layer, and causing packaging failure. After the water vapor enters the display area, it reacts with luminescent material, resulting in hole black spots/rings, seriously affecting the service life of the product.

Therefore, it is necessary to provide a display panel and a display device to improve this defect.

SUMMARY

Embodiments of the present disclosure provide a display panel and a display device that may inhibit electrochemical corrosion in a conductive circuit between a cathode and a metal partition structure, thereby improving packaging performance of the display panel, extending a reliability test time, and extending a service life of the product.

Embodiments of the present disclosure provide a display panel, including a hole area, a transition area arranged at a periphery of the hole area, and a display area arranged at a periphery of the transition area. The display panel further includes:

a substrate;

a dam, disposed on the substrate and located in the transition area;

a first metal partition structure, disposed on the substrate, located in the transition area, and arranged on a side of the dam away from the hole area, wherein a first undercut structure is recessed on a side of the first metal partition structure close to the dam;

a common layer, including a first common part and a second common part, wherein the first common part continuously extends from the display area to an upper surface of the first metal partition structure facing away from the substrate, the second common part extends in a direction away from the hole area, an end of the second common part away from the hole area is located in the first undercut structure, and the first common part is disconnected from the second common part;

a cathode, including a first cathode part and a second cathode part, wherein the first cathode part is disposed on a surface of the first common part, an end of the second cathode part is disposed in the first undercut structure and on a surface of the second common part, and the first cathode part is disconnected from the second cathode part.

Embodiments of the present disclosure also provide a display device including a display panel. The display panel includes a hole area, a transition area arranged at a periphery of the hole area, and a display area arranged at a periphery of the transition area. The display panel also includes:

a substrate;

a dam, disposed on the substrate and located in the transition area;

a first metal partition structure, disposed on the substrate, located in the transition area, and arranged on a side of the dam away from the hole area, wherein a first undercut structure is recessed on a side of the first metal partition structure close to the dam;

a common layer, including a first common part and a second common part, wherein the first common part continuously extends from the display area to an upper surface of the first metal partition structure facing away from the substrate, the second common part extends in a direction away from the hole area, an end of the second common part away from the hole area is located in the first undercut structure, and the first common part is disconnected from the second common part;

a cathode, including a first cathode part and a second cathode part, wherein the first cathode part is disposed on a surface of the first common part, an end of the second cathode part is disposed in the first undercut structure and on a surface of the second common part, and the first cathode part is disconnected from the second cathode part.

DESCRIPTION OF DRAWINGS

In order to explain technical solutions in the embodiments or related art more clearly, the drawings needed to be used in the description of the embodiments or the related art will be briefly introduced below. Obviously, the drawings in the following description are only for some disclosed embodiments, for those of ordinary skill in the art, other drawings may be obtained based on these drawings without creative efforts.

EMBODIMENTS OF THE INVENTION

Figure 1:
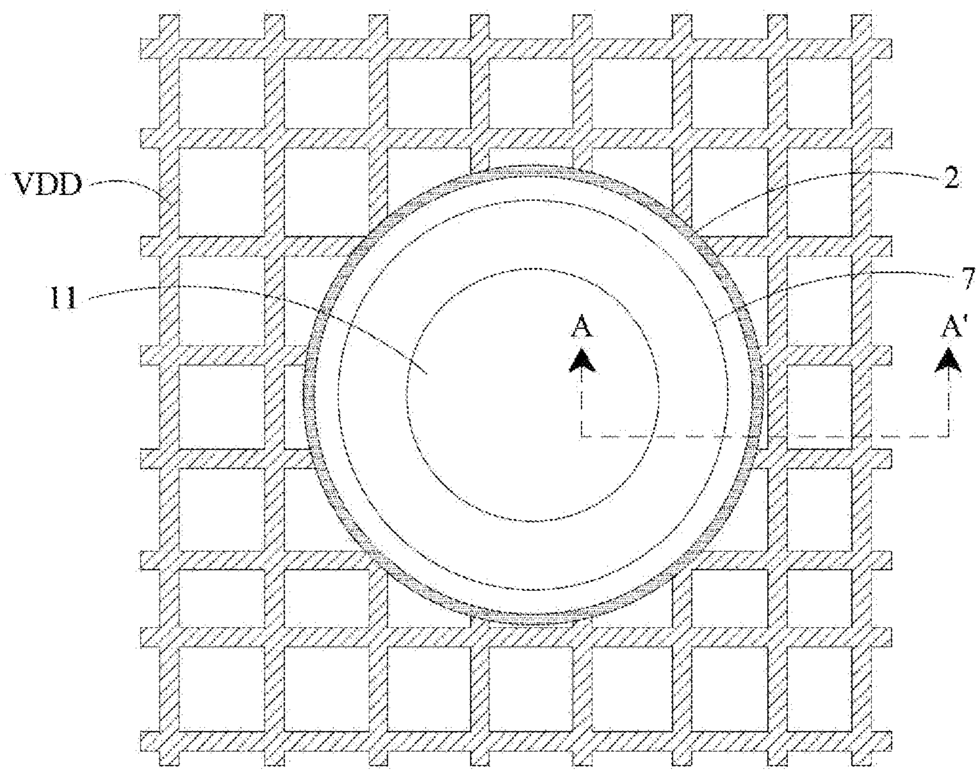
FIG. 1 is a partial plan view of a display panel provided by an embodiment of the present disclosure.

The following description of the embodiments refers to the accompanying drawings to illustrate specific embodiments in which the present disclosure may be implemented. Orientational terms mentioned in this disclosure, such as “upper”, “lower”, “front”, “rear”, “left”, “right”, “inner”, “outer”, “side”, etc., refer only to the directions of the accompanying drawings. Therefore, the orientational terms used are to explain and understand the present disclosure, but not to limit the present disclosure. In the drawings, units with similar structures are represented by the same numbers.

The present disclosure will be further described below in conjunction with the accompanying drawings and specific embodiments.

Embodiments of the present disclosure provide a display panel that may inhibit electrochemical corrosion in a conductive circuit between a cathode and a metal partition structure, thereby improving packaging performance of the display panel, extending a reliability test time, and extending a service life of the product.

The display panel includes a hole area, a transition area arranged at a periphery of the hole area, and a display area arranged at a periphery of the transition area. The display panel further includes:

a substrate;

a dam, disposed on the substrate and located in the transition area;

a first metal partition structure, disposed on the substrate, located in the transition area, and arranged on a side of the dam away from the hole area, wherein a first undercut structure is recessed on a side of the first metal partition structure close to the dam;

a common layer, including a first common part and a second common part, wherein the first common part continuously extends from the display area to an upper surface of the first metal partition structure facing away from the substrate, the second common part extends in a direction away from the hole area, an end of the second common part away from the hole area is located in the first undercut structure, and the first common part is disconnected from the second common part;

a cathode, including a first cathode part and a second cathode part, wherein the first cathode part is disposed on a surface of the first common part, an end of the second cathode part is disposed in the first undercut structure and on a surface of the second common part, and the first cathode part is disconnected from the second cathode part.

According to an embodiment of the present disclosure, the display panel further includes a high-voltage direct current (DC) power signal trace and a low-voltage DC power signal trace, the first metal partition structure is electrically connected to the high-voltage DC power signal trace, and the cathode is electrically connected to the low-voltage DC power signal trace.

According to an embodiment of the present disclosure, the high-voltage DC power signal trace surrounds the first metal partition structure, and overlaps with a periphery of the first metal partition structure at many places.

According to an embodiment of the present disclosure, the high-voltage DC power signal trace is grid-shaped.

According to an embodiment of the present disclosure, the high-voltage DC power signal trace and the first metal partition structure are arranged in a same layer.

According to an embodiment of the present disclosure, the display panel includes an organic insulation layer that at least covers a side of the first metal partition structure close to the display area, and the first common part is partially disposed on a surface of the organic insulation layer.

According to an embodiment of the present disclosure, the organic insulation layer covers at least part of the surface of the first metal partition structure facing away from the substrate.

According to an embodiment of the present disclosure, the organic insulation layer includes at least one planarization layer and a pixel definition layer disposed on the planarization layer, and at least one of the planarization layer and the pixel definition layer at least covers the side of the first metal partition structure close to the display area.

According to an embodiment of the present disclosure, the display panel includes a first source-drain electrode layer, the organic insulation layer includes a first planarization layer, and the first source-drain electrode layer is disposed between the first planarization layer and the substrate.

The first metal partition structure is arranged on a same layer as the first source-drain electrode layer.

According to an embodiment of the present disclosure, the display panel includes a first source-drain electrode layer, a first planarization layer, a second source-drain electrode layer, and a second planarization layer stacked on the substrate.

The first metal partition structure is arranged on a same layer as the second source-drain electrode layer, an edge of the first planarization layer close to the hole area is located on the side of the first metal partition structure close to the display area, and at least one of the second planarization layer and the pixel definition layer at least covers the side of the first metal partition structure close to the display area.

According to an embodiment of the present disclosure, the display panel includes a first source-drain electrode layer, a first planarization layer, a second source-drain electrode layer, a second planarization layer, a third source-drain electrode layer, and a third planarization layer stacked on the substrate.

The first metal partition structure is arranged on a same layer as the third source-drain electrode layer, an edge of the first planarization layer and an edge of the second planarization layer close to the hole area are both located on the side of the first metal partition structure close to the display area, and at least one of the third planarization layer and the pixel definition layer at least covers the side of the first metal partition structure close to the display area.

According to an embodiment of the present disclosure, in a direction perpendicular to the substrate, an edge of the first common part close to the first undercut structure is further away from the substrate than an edge of the second common part close to the first undercut structure, and an edge of the first cathode part close to the first undercut structure is further away from the substrate than an edge of the second cathode part close to the first undercut structure.

According to an embodiment of the present disclosure, the first metal partition structure includes a first conductive layer, a second conductive layer, and a third conductive layer stacked on the substrate, an end of the second conductive layer close to the hole area is retracted from ends of the first conductive layer and the third conductive layer close to the hole area, and the end of the second conductive layer close to the hole area is enclosed with the ends of the first conductive layer and the third conductive layer close to the hole area to form the first undercut structure.

According to an embodiment of the present disclosure, the second common part is in contact with the first conductive layer, the end of the second common part located in the first undercut structure is disconnected from the second conductive layer, the second cathode part is in contact with the first conductive layer, and the end of the second cathode part located in the first undercut structure is disconnected from the second conductive layer.

According to an embodiment of the present disclosure, the display panel further includes:

a second metal partition structure, disposed on the substrate, disposed on a side of the dam close to the hole area, and surrounding the hole area.

At least one of a side of the second metal partition structure close to the hole area and a side of the second metal partition structure close to the dam is recessed to form a second undercut structure, the second common part includes a first common sub-part and second common sub-parts, the first common sub-part is disposed on a surface of the second metal partition structure facing away from the substrate, the second common sub-parts are disposed on opposite sides of the second metal partition structure and placed in the first undercut structure and the second undercut structure, and the first common sub-part and the second common sub-parts are disconnected.

The second cathode part includes a first cathode sub-part and second cathode sub-parts, the first cathode sub-part is disposed on a surface of the first common sub-part, the second cathode sub-parts are disposed on surfaces of the second common sub-parts, ends of the second cathode sub-parts are disposed in the first undercut structure and the second undercut structure, and the first cathode sub-part and the second cathode sub-parts are disconnected.

According to an embodiment of the present disclosure, the second metal partition structure includes a fourth conductive layer, a fifth conductive layer, and a sixth conductive layer stacked on the substrate, an end of the fifth conductive layer close to the hole area is retracted from ends of the fourth conductive layer and the sixth conductive layer close to the hole area, and the end of the fifth conductive layer close to the hole area is enclosed with the ends of the fourth conductive layer and the sixth conductive layer close to the hole area to form the second undercut structure; and/or an end of the fifth conductive layer close to the dam is retracted from ends of the fourth conductive layer and the sixth conductive layer close to the dam, and the end of the fifth conductive layer close to the dam is enclosed with the ends of the fourth conductive layer and the sixth conductive layer close to the dam to form the second undercut structure.

According to an embodiment of the present disclosure, the display panel further includes a plurality of bosses, some of the bosses are disposed between the first metal partition structure and the substrate, and the other some of the bosses are disposed between the second metal partition structure and the substrate.

According to an embodiment of the present disclosure, the display panel further includes an encapsulation layer, the encapsulation layer is continuously provided in the transition area and the display area, the encapsulation layer covers the common layer, the cathode, the first metal partition structure, the first undercut structure, the second metal partition structure, and the second undercut structure.

According to an embodiment of the present disclosure, the common layer includes a hole injection layer, a hole transport layer, an electron transport layer, and an electron injection layer, which are stacked.

Beneficial effects of the embodiments of the present disclosure: Embodiments of the present disclosure provide display panels and display devices. The display panel includes the substrate, the first metal partition structure, the common layer, and the cathode. The first undercut structure is recessed on the side of the first metal partition structure close to the hole area. The common layer includes the first common part and the second common part. The cathode layer includes the first cathode part and the second cathode part, and the segment difference formed by the first undercut structure may not only disconnect the first common part and the second common part, cut off the path of water vapor from intruding into the display area through the common layer, prevent water vapor from laterally intruding into the display area through the common layer, and also separate the charged first cathode part from the uncharged second cathode part close to the hole area, which prevents the electrically conductive path formed by the overlapping of the charged first cathode part and the first metal partition structure from causing electrochemical corrosion, thereby improving packaging performance and increasing the service life of the product.

Figure 2:
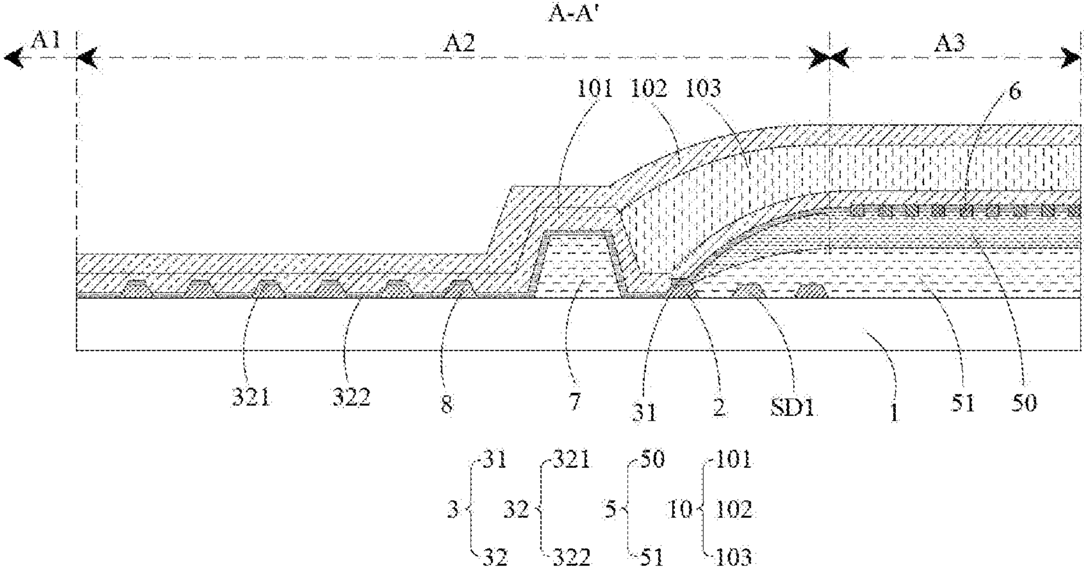
FIG. 2 is a first cross-sectional view of the display panel provided by an embodiment of the present disclosure along an A-A' direction illustrated in FIG. 1.

As illustrated in FIG. 1 and FIG. 2, FIG. 1 is a partial plan view of a display panel provided by an embodiment of the present disclosure, and FIG. 2 is a first cross-sectional view of the display panel provided by an embodiment of the present disclosure along an A-A' direction illustrated in FIG. 1. The display panel includes a hole area A1, a transition area A2 arranged at a periphery of the hole area A1, and a display area A3 arranged at a periphery of the transition area A2. The hole area A1 is configured to place a camera component and provide a path for the camera component to obtain external light. The transition area A2 serves as a transition between the hole area A1 and the display area A3 to prevent water vapor from the external environment from intruding into the display area A3 through the hole area A1. The display area A3 is mainly configured to realize a function of image display. Neither the hole area A1 nor the transition area A2 has the function of image display.

The hole area A1 is provided with a light-transmitting hole 11. The light-transmitting hole 11 penetrates the display panel in a thickness direction of the display panel, or only penetrates part of film layers of the display panel, but does not penetrate the display panel. The camera component is correspondingly arranged in or below the light-transmitting hole 11, and the camera component obtains external light through the light-transmitting hole 11.

In an embodiment, a size and a shape of the light-transmitting hole are the same as a size and a shape of the hole area A1. The shape of the hole area A1 is circular. The transition area A2 is arranged around the hole area A1. A shape of the transition area A2 is regarded as a closed ring, and the display area A3 is arranged around the transition area A2.

In some other embodiments, a number of hole areas A1 and a number of light-transmitting holes are not limited to one in the above embodiment, but may also be two or more, and the shape of the hole area A1 is not limited to the circular in the above embodiment, it can also be an ellipse, a long strip, a drop shape, or other unconventional shapes, and the shapes of the transition area A2 and the display area A3 only need to match the shape of the hole area A1.

As illustrated in FIG. 1 and FIG. 2, the display panel includes a substrate 1, a dam 7, and a first metal partition structure 2. The dam 7 is provided on the substrate 1. The dam 7 is located in the transition area A2 and arranged around the hole area A1. The first metal partition structure 2 is arranged on the substrate 1. The first metal partition structure 2 is located in the transition area A2 and arranged on a side of the dam 7 away from the hole area A1. The first metal partition structure 2 is arranged around the hole area A1. A shape of an orthographic projection of the first metal partition structure 2 on the substrate 1 is a closed ring.

It should be noted that the substrate 1 is an array substrate. The substrate 1 includes a base and an inorganic insulation layer, a gate metal layer, an active layer, a source-drain electrode layer, etc. arranged on the base. The base is a flexible base, and a material of the base may be but not limited to polyimide. The fact that the first metal partition structure 2 is disposed on the substrate 1 may mean that the first metal partition structure 2 is disposed on a surface of the base and is in direct contact with the surface of the base, or it may also mean that the first metal partition structure 2 is disposed on a surface of the base and the first metal partition structure 2 is separated from the surface of the base by an inorganic insulation layer or other film layers.

Figure 3:
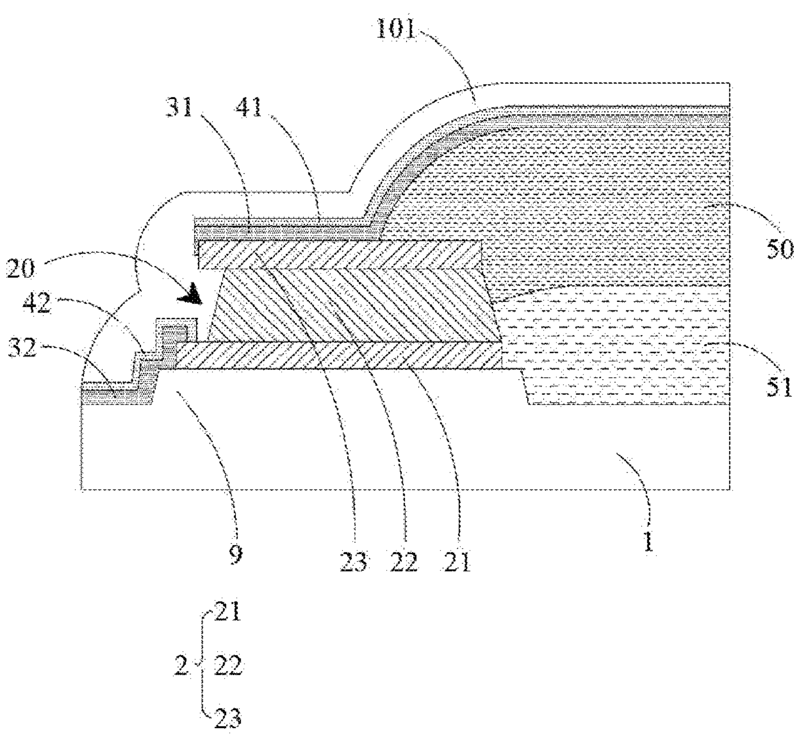
FIG. 3 is an enlarged schematic view of a first metal partition structure illustrated in FIG. 2.

As illustrated in FIG. 2 and FIG. 3, FIG. 3 is an enlarged schematic view of the first metal partition structure in FIG. 2. A first undercut structure 20 is recessed on a side of the first metal partition structure 2 close to the hole area A1. The undercut structure 20 is formed by recessing a middle area of the side of the first metal partition structure 2 close to the hole area A1 toward inside of the first metal partition structure 2, and a side of the first metal partition structure 2 close to the display area A3 is not provided with grooves.

The display panel also includes a common layer 3. The common layer 3 includes a first common part 31 and a second common part 32. The first common part 31 continuously extends from the display area A3 to an upper surface of the first metal partition structure 2 facing away from the substrate 1. The second common part 32 extends in a direction away from the hole area A1, and an end of the second common part 32 away from the hole area is located in the first undercut structure 20. The first common part 31 is disconnected from the second common part 32. The first common part 31 and the second common part 32 have the same film structure and material.

The common layer 3 includes, but is not limited to, a hole injection layer, a hole transport layer, an electron transport layer, and an electron injection layer, which are stacked. The display panel also includes a plurality of patterned light-emitting layers 6. The light-emitting layer 6 is disposed between the hole transport layer and the electron transport layer. The hole injection layer, the hole transport layer, the electron injection layer, and the electron transport layer are all prepared by an entire surface evaporation process. Since the first undercut structure 20 is formed on the side of the first metal partition structure 2 close to the hole area A1, a segment difference is formed between a surface of the first metal partition structure 2 facing away from the substrate 1 and the bottom of the first metal partition structure 2. When the above-mentioned film layers are formed by evaporation, due to a thin thickness of the common layer 3, the segment difference cannot be filled up, so that the first common part 31 and the second common part 32 are formed, and the first common part 31 and the second common part 32 are disconnected at the side of the first metal partition structure 2 close to the hole area A1. Under this structure, after external water vapor invades into the second common part 32 through the light-transmitting hole in the hole area A1, the water vapor cannot continue to invade into the first common part 31 because the first common part 31 and the second common part 32 are disconnected, thus the water vapor cannot further invade into the display area A3 through the second common part 32, thereby preventing the water vapor from intruding into the display area A3 and causing damage to the luminescent material.

As illustrated in FIG. 3, in a direction perpendicular to the substrate 1, an edge of the first common part 31 close to the first undercut structure 20 is further away from the substrate 1 than an edge of the second common part 32 close to the first undercut structure 20. That is, the edge of the first common part 31 close to the first undercut structure 20 and the edge of the second common part 32 close to the first undercut structure 20 are located on horizontal planes with different heights, and a distance between the plane where the edge of the first common part 31 close to the first undercut structure 20 is located and the substrate 1 is greater than a distance between the plane where the edge of the second common part 32 close to the first undercut structure 20 is located and the substrate 1.

As illustrated in FIG. 2 and FIG. 3, the display panel further includes a cathode 4. The cathode 4 includes a first cathode part 41 and a second cathode part 42. The first cathode part 41 is disposed on the surface of the first common part 31. Both the first cathode part 41 and the first common part 31 extend continuously from the display area A3 to the surface of the first metal partition structure 2 facing away from the substrate 1. An end of the second cathode part 42 is disposed in the first undercut structure 20 and on a surface of the second common part 32. The first cathode part 41 and the second cathode part 42 are provided apart from each other. Under this structure, the first cathode part 41 and the second cathode part 42 are separated by the first metal partition structure 2, and the first cathode part 41 is only continuously distributed in the display area A3 until the upper surface of the first metal partition structure 2 facing away from the substrate 1, which may avoid electro-chemical corrosion of an electrically conductive path formed by the overlapping of the charged first cathode part 41 and the first metal partition structure 2, thereby improving the packaging performance and increasing the service life of the product.

It should be noted that the cathode 4 is also prepared using a whole surface evaporation process. A principle of disconnecting the first cathode part 41 and the second cathode part 42 at the side of the first metal partition structure 2 close to the hole area A1 is the same as a principle of the above-mentioned disconnection of the first common part 31 and the second common part 32 of the common layer 3, which will not be repeated here.

As illustrated in FIG. 3, in the direction perpendicular to the substrate 1, an edge of the first cathode part 41 close to the first undercut structure 20 is further away from the substrate 1 than an edge of the second cathode part 42 close to the first undercut structure 20. That is, the edge of the first cathode part 41 close to the first undercut structure 20 and the edge of the second cathode part 42 close to the first undercut structure 20 are located on horizontal planes with different heights, and a distance between the plane where the edge of the first cathode part 41 close to the first undercut structure 20 is located and the substrate 1 is greater than a distance between the plane where the edge of the second cathode part 42 close to the first undercut structure 20 is located and the substrate 1.

In an energized state, a voltage of the first cathode part 41 is a negative voltage, and a voltage of the first metal partition structure 2 is a positive voltage. When the second cathode part 42 is deposited in the first undercut structure 20 and overlaps with the first metal partition structure 2 to form a conductive path, since the voltage of the first metal partition structure 2 is the positive voltage, a voltage of the second cathode part 42 overlapping the first metal partition structure 2 is also a positive voltage. Since a voltage of the electrolyte environment formed after water vapor and $K^+$ in the polarizer enter the interior of the panel is a positive voltage, and the voltage of the first metal partition structure 2 is also the positive voltage, there is no electrode for electrochemical corrosion to occur. Therefore, embodiments of the present disclosure may destroy the conditions for electrochemical corrosion to occur and inhibit electrochemical corrosion in the conductive path between the cathode 4 and the first metal partition structure 2, thereby improving packaging performance and increasing product life.

In some embodiments, as illustrated in FIG. 1, the display panel also includes a high-voltage DC power signal trace VDD and a low-voltage DC power signal trace (not shown in the figures). The first metal partition structure 2 is electrically connected to the high-voltage DC power signal trace VDD, and the cathode 4 is electrically connected to the low-voltage DC power supply signal trace. The high-voltage DC power signal trace VDD transmits a high-voltage DC power signal, which is a constant positive voltage DC signal. The low-voltage DC power signal trace transmits a low-voltage DC power signal, which is a constant negative voltage DC signal. Under this structure, by electrically connecting the first metal partition structure 2 to the high-voltage DC power signal trace VDD, the high-voltage DC power signal trace VDD is configured to output the positive voltage to the first metal partition structure 2 to destroy conditions for electrochemical corrosion and inhibit electrochemical corrosion in the conductive path between the cathode 4 and the first metal partition structure 2.

In an embodiment, as illustrated in FIG. 1, the first metal partition structure 2 is a closed loop in a top view, and the high-voltage DC power signal trace VDD is disposed at a periphery of the first metal partition structure 2 and surrounds the first metal partition structure 2. The high-voltage DC power signal trace VDD overlaps with the periphery of the first metal partition structure 2 at many places. By arranging multiple overlapping points at the periphery of the first metal partition structure 2 to overlap the high-voltage DC power signal trace VDD with the first metal partition structure 2, a contact area between the high-voltage DC power signal trace VDD and the first metal partition structure 2 may be increased, and an impedance between the high-voltage DC power signal trace VDD and the first metal partition structure 2 is reduced.

In an embodiment, as illustrated in FIG. 1, the high-voltage DC power signal trace VDD is grid-shaped.

In some embodiments, the display panel includes an organic insulation layer 5. The organic insulation layer 5 at least covers the side of the first metal partition structure 2 close to the display area A3. The first common part 31 is partially disposed on a surface of the organic insulation layer 5.

In an embodiment, as illustrated in FIG. 1, the organic insulation layer 5 covers the side of the first metal partition structure 2 close to the display area A3, and the first common part 31 and the first cathode part 41 are both continuously spread from the surface of the first metal partition structure 2 facing away from the substrate 1 to the surface of the organic insulation layer 5. The organic insulation layer 5 insulates and separates the first cathode part 41 from the first metal partition structure 2. There is no organic insulation layer provided for covering the side of the first metal partition structure 2 close to the hole area A1. In this way, the organic insulation layer 5 may be configured to protect the side of the first metal partition structure 2 close to the display area A3 to avoid etching the side of the first metal partition structure 2 close to the display area A3 when etching to form the first undercut structure 20, so that the first common part 31 and the first cathode part 41 can be continuously distributed from the surface of the first metal partition structure 2 facing away from the substrate 1 to the display area A3, and the first common part 31 and the first cathode part 41 are prevented from being disconnected at the side of the first metal partition structure 2 close to the display area A3 and overlapped with the first metal partition structure 2.

In some embodiments, the organic insulation layer 5 not only covers the side of the first metal partition structure 2 close to the display area A3, but also covers at least part of the surface of the first metal partition structure 2 facing away from the substrate 1.

In an embodiment, as illustrated in FIG. 1, the organic insulation layer 5 covers a part of the surface of the first metal partition structure 2 facing away from the substrate 1 and close to the display area A3 and the side of the first metal partition structure 2 close to the display area A3. By extending a coverage of the organic insulation layer 5 to the surface of the first metal partition structure 2 facing away from the substrate 1, that the organic insulation layer 5 covers the side of the first metal partition structure 2 close to the display area A3 can be ensured, so that the segment difference formed by etching the side of the first metal partition structure 2 close to the display area A3 can be avoid, where the segment difference may cause the first common part 31 and the first cathode part 41 to be disconnected on the side of the first metal partition structure 2 close to the display area A3 and overlap with the first metal partition structure 2.

In an embodiment, the organic insulation layer 5 not only covers the side of the first metal partition structure 2 close to the display area A3, but also completely covers the surface of the first metal partition structure 2 facing away from the substrate 1.

In some embodiments, the organic insulation layer 5 includes at least one planarization layer and a pixel definition layer 50 disposed on the planarization layer. At least one of the planarization layer and the pixel definition layer 50 at least covers the side of the first metal partition structure 2 close to the display area A3.

In an embodiment, as illustrated in FIG. 3, the organic insulation layer 5 includes a first planarization layer 51 and the pixel definition layer 50. The first planarization layer 51 is disposed on the substrate 1, and the pixel definition layer 50 is disposed on a surface of the first planarization layer 51 facing away from the substrate 1. The first planarization layer 51 and the pixel definition layer 50 are both made of organic insulating materials. The pixel definition layer 50 is provided with a plurality of pixel openings, and the light-emitting layers 6 are disposed in the pixel openings. The first planarization layer 51 covers one part of the side of the first metal partition structure 2 close to the display area A3, the pixel definition layer 50 covers part of the surface of the first metal partition structure 2 facing away from the substrate 1, and also covers the other part of the side of the first metal partition structure 2 close to the display area A3 that is not covered by the first planarization layer 51.

In an embodiment, an edge of the first planarization layer 51 close to the hole area A1 is located on the side of the first metal partition structure 2 close to the display area A3, that is, the first planarization layer 51 does not cover the side of the first metal partition structure 2 close to the display area A3, and the pixel definition layer 50 covers the side of the first metal partition structure 2 close to the display area A3. Based on this structure, the pixel definition layer 50 further covers at least part of the surface of the first metal partition structure 2 facing away from the substrate 1.

In an embodiment, the first planarization layer 51 covers the side of the first metal partition structure 2 close to the display area A3, and the edge of the pixel definition layer 50 close to the hole area A1 is located on the side of the first metal partition structure 2 close to the display area A3. That is, the pixel definition layer 50 does not cover the side of the first metal partition structure 2 close to the display area A3. Based on this structure, the first planarization layer 51 can further cover at least part of the surface of the first metal partition structure 2 facing away from the substrate 1.

In an embodiment, as illustrated in FIG. 3, the display panel further includes a first source-drain electrode layer SD1 disposed between the first planarization layer 51 and the substrate 1. The first metal partition structure 2 is arranged on the same layer as the first source-drain electrode layer SD1. A film structure and material of the first metal partition structure 2 are the same as a film structure and material of the first source-drain electrode layer SD1, that is, the first metal partition structure 2 is simultaneously prepared in a manufacturing process of the first source-drain electrode layer SD1.

In an embodiment, the high-voltage DC power signal trace VDD is placed on the same layer as the first metal partition structure 2, and a film structure and material of the high-voltage DC power signal trace VDD are the same as a film structure and material of the first metal partition structure 2, that is, the first metal partition structure 2 and the high-voltage DC power signal trace VDD can be simultaneously prepared in the manufacturing process the first source-drain electrode layer SD1.

In some other embodiments, the high-voltage DC power signal trace VDD and the first metal partition structure 2 are arranged in different layers. For example, the high-voltage DC power signal trace VDD may be disposed on the gate metal layer, or when the display panel includes multiple source-drain electrode layers, the high-voltage DC power signal trace VDD and the first metal partition structure 2 are respectively on different source-drain electrode layers. The high-voltage DC power signal trace VDD and the first metal partition structure 2 may be electrically connected through a via hole on the insulation layer.

In some embodiments, the display panel includes the first source-drain electrode layer SD1, the first planarization layer 51, a second source-drain electrode layer SD2, and a second planarization layer 52 stacked on the substrate 1. The first metal partition structure 2 is arranged on the same layer as the second source-drain electrode layer SD2. An edge of the first planarization layer 51 close to the hole area A1 is located on the side of the first metal partition structure 2 close to the display area A3. At least one of the second planarization layer 52 and the pixel definition layer 50 at least covers the side of the first metal partition structure 2 close to the display area A3.

Figure 5:
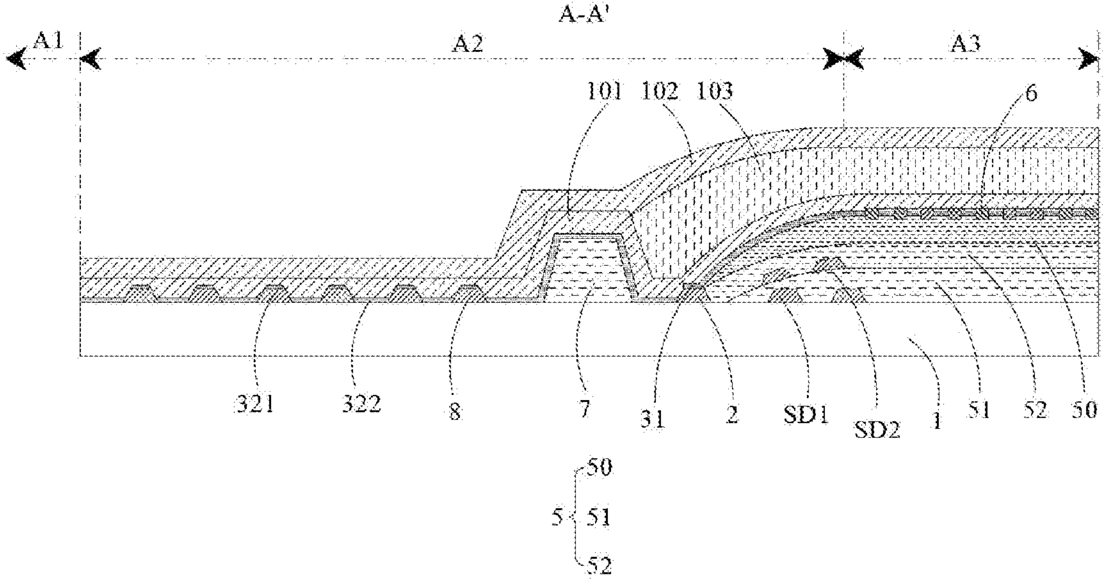
FIG. 5 is a second cross-sectional view of the display panel provided by an embodiment of the present disclosure along the A-A' direction illustrated in FIG. 1.

In an embodiment, as illustrated in FIG. 5, FIG. 5 is a second cross-sectional view of the display panel provided by an embodiment of the present disclosure along the A-A' direction illustrated in FIG. 1, and the structure illustrated in FIG. 5 is roughly the same as the structure of the display panel illustrated in FIG. 2, the difference is: the organic insulation layer 5 includes the first planarization layer 51 and a second planarization layer 52, the display panel includes the first source-drain electrode layer SD1 and the second source-drain electrode layer SD2, and the first planarization layer 51 covers the first source-drain electrode layer SD1, the second source-drain electrode layer SD2 is disposed on the first planarization layer 51, the first metal partition structure 2 and the second source-drain electrode layer SD2 are disposed on the same layer, and the first metal partition structure 2 is disposed on the substrate 1. The edge of the first planarization layer 51 close to the hole area A1 is located on the side of the first metal partition structure 2 close to the display area A3. The second planarization layer 52 and the pixel definition layer 50 both cover the side of the first metal partition structure 2 close to the display area A3 and part of the surface of the first metal partition structure 2 facing away from the substrate 1.

In an embodiment, the edges of the first planarization layer 51 and the second planarization layer 52 close to the hole area A1 are located on the side of the first metal partition structure 2 close to the display area A3, and the pixel definition layer 50 covers the side of the first metal partition structure 2 close to the display area A3 and part of the surface of the first metal partition structure 2 facing away from the substrate 1.

In an embodiment, the edges of the first planarization layer 51 and the pixel definition layer 50 close to the hole area A1 are located on the side of the first metal partition structure 2 close to the display area A3, and the second planarization layer 52 covers the side of the first metal partition structure 2 close to the display area A3 and part of the surface of the first metal partition structure 2 facing away from the substrate 1.

In an embodiment, when the display panel includes the first source-drain electrode layer SD1 and the second source-drain electrode layer SD2, the first metal partition structure 2 may also be provided in the same layer as the first source-drain electrode layer SD1.

In some embodiments, the display panel includes the first source-drain electrode layer SD1, the first planarization layer 51, the second source-drain electrode layer SD2, the second planarization layer 52, a third source-drain electrode layer SD3, and a third planarization layer 53 stacked on the substrate 1. The first metal partition structure 2 and the third source-drain electrode layer SD3 are arranged in the same layer. The edges of the first planarization layer 51 and the second planarization layer 52 close to the hole area A1 are located on the side of the first metal partition structure 2 close to the display area A3, and at least one of the third planarization layer 53 and the pixel definition layer 50 covers at least the side of the first metal partition structure 2 close to the display area A3.

Figure 6:
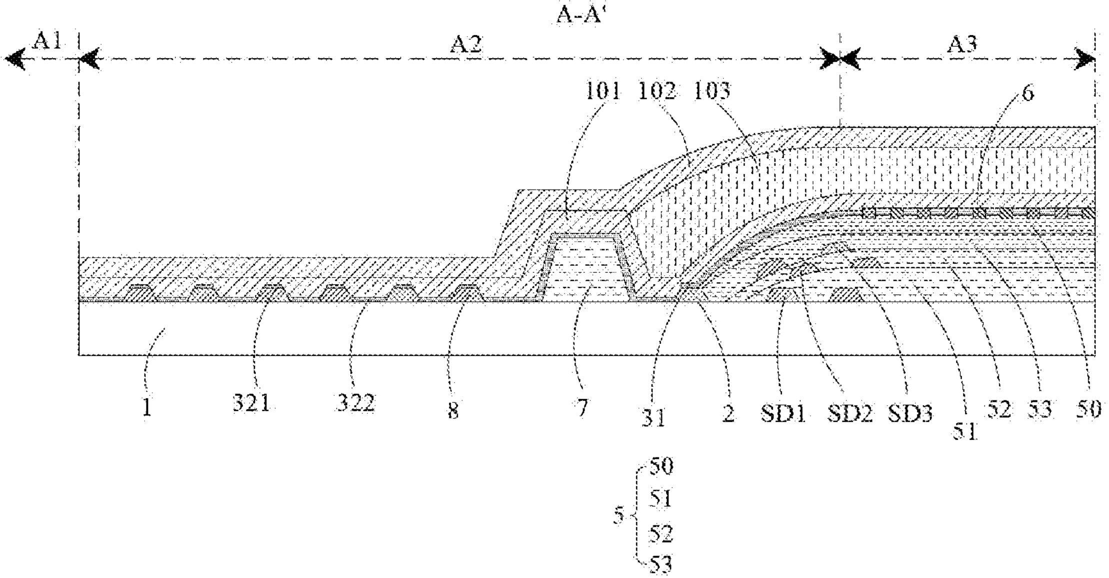
FIG. 6 is a third cross-sectional view of the display panel provided by an embodiment of the present disclosure along the A-A' direction illustrated in FIG. 1.

In an embodiment, as illustrated in FIG. 6, FIG. 6 is a third cross-sectional view of the display panel provided by an embodiment of the present disclosure along the A-A' direction illustrated in FIG. 1, and the structure illustrated in FIG. 6 is roughly the same as the structure of the display panel illustrated in FIG. 2, the difference is: the organic insulation layer 5 includes the first planarization layer 51, the second planarization layer 52, and the third planarization layer 53, and the display panel includes the first source-drain electrode layer SD1, the second source-drain electrode layer SD2, and the third source-drain electrode layer SD3, the first metal partition structure 2 and the third source-drain electrode layer SD3 are arranged in the same layer, the edges of the first planarization layer 51 and the second planarization layer 52 close to the hole area A1 are located on the side of the first metal partition structure 2 close to the display area A3, and the third planarization layer 53 and the pixel definition layer 50 both cover the side of the first metal partition structure 2 close to the display area A3 and part of the surface of the first metal partition structure 2 facing away from the substrate 1.

In an embodiment, the edges of the first planarization layer 51, the second planarization layer 52, and the third planarization layer 53 close to the hole area A1 are all located on the side of the first metal partition structure 2 close to the display area A3, and the pixel definition layer 50 covers the side of the first metal partition structure 2 close to the display area A3 and part of the surface of the first metal partition structure 2 facing away from the substrate 1.

In some other embodiments, when the display panel includes the first source-drain electrode layer SD1, the second source-drain electrode layer SD2, and the third source-drain electrode layer SD3, the first metal partition structure 2 may also be arranged on the same layer as the second source-drain electrode layer SD2 or the first source-drain electrode layer SD1.

In some embodiments, as illustrated in FIG. 3, the first metal partition structure 2 includes a first conductive layer 21, a second conductive layer 22, and a third conductive layer 23 stacked on the substrate 1. The second conductive layer 22 is provided between the first conductive layer 21 and the third conductive layer 23, an end of the second conductive layer 22 close to the hole area A1 is retracted from ends of the first conductive layer 21 and the third conductive layer 23 close to the hole area A1.

The end of the second conductive layer 22 close to the hole area A1 is enclosed with the ends of the first conductive layer 21 and the third conductive layer 23 close to the hole area A1 to form the first undercut structure 20. The first undercut structure 20 can be regarded as a groove formed on the side of the first metal partition structure close to the hole area A1, a side of the second conductive layer 22 close to the hole area A1 serves as a groove bottom of the first undercut structure 20, and a surface of the first conductive layer 21 close to the third conductive layer 23 and a surface of the third conductive layer 23 close to the first conductive layer 21 serve as groove walls of the first undercut structure 20.

The second common part 32 is in contact with the first conductive layer 21, and an end of the second common part 32 located in the first undercut structure 20 is disconnected from the second conductive layer 22. The second cathode part 42 is in contact with the first conductive layer 21, and an end of the second cathode part 42 located in the first undercut structure 20 is disconnected from the second conductive layer 22. Thus, the voltage of the first metal partition structure 2 is transmitted to the second cathode part 42, so that the voltage of the second cathode part 42 is positive, thereby destroying the conditions for electrochemical corrosion to occur and inhibiting electrochemical corrosion in the conductive path between the cathode 4 and the first metal partition structure 2.

In an embodiment, the second conductive layer 22 and the first conductive layer 21 are made of different materials, the first conductive layer 21 and the third conductive layer 23 are made of the same material, and an etching rate of the second conductive layer 22 is greater than an etching rate of the first conductive layer 21 and an etching rate of the third conductive layer 23, so as to ensure that when etching the first metal partition structure 2, an etching degree of the second conductive layer 22 is greater than an etching degree of the first conductive layer 21 and an etching degree of the third conductive layer 23, so as to facilitate the formation of the first undercut structure 20.

In an embodiment, the first conductive layer 21 and the third conductive layer 23 are made of titanium, and the second conductive layer 22 is made of aluminum.

Figure 4:
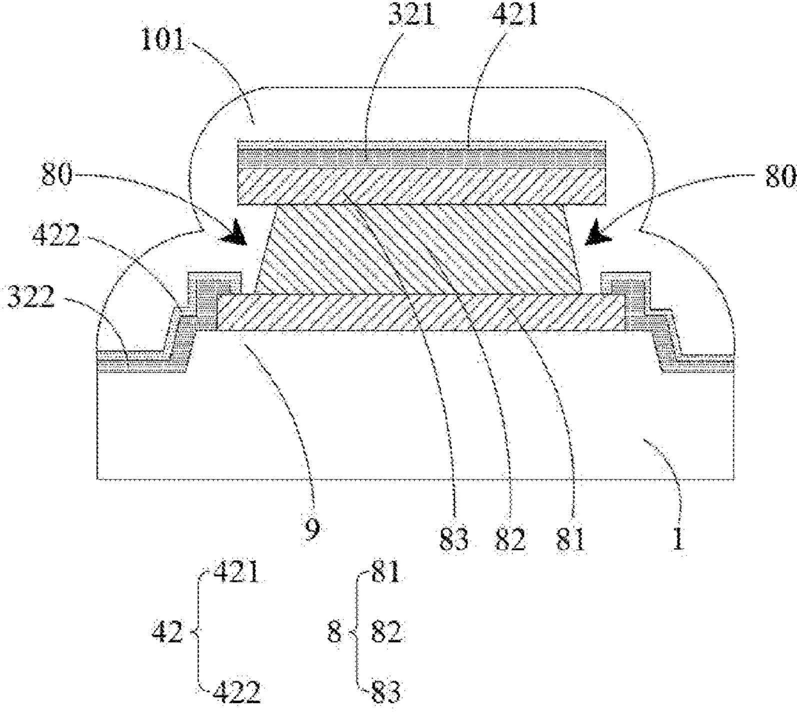
FIG. 4 is an enlarged schematic view of a second metal partition structure illustrated in FIG. 2.

In some embodiments, as illustrated in FIG. 1, FIG. 2, and FIG. 4, FIG. 4 is an enlarged schematic view of the second metal partition structure in FIG. 2, and the display panel also includes the dam 7 and at least one second metal partition structure 8. The dam 7 is provided on the substrate 1. The dam 7 is located on the side of the first metal partition structure 2 close to the hole area A1. The dam 7 is arranged around the hole area A1. The dam 7 may be made of a material same as at least one layer of the organic insulation layer 5. For example, the dam 7 and the pixel definition layer 50 are made of the same material, and the dam 7 and the pixel definition layer 50 are simultaneously prepared in the same manufacturing process. The material of the dam 7 may also be the same as the material of the planarization layer; or the dam 7 includes at least two upper and lower parts, one part of which is made of the same material of the planarization layer, and the other part of which is made of the same material as the pixel definition layer.

The second metal partition structure 8 is provided on the substrate 1. The at least one second metal partition structure 8 is located on the side of the dam 7 close to the hole area A1, and the second metal partition structure 8 is arranged around the hole area A1.

At least one of a side of the second metal partition structure 8 close to the hole area A1 and a side of the second metal partition structure 8 close to the dam 7 is recessed to form a second undercut structure 80. The second common part 32 includes at least one first common sub-part 321 and second common sub-parts 322. The first common sub-part 321 is disposed on a surface of the second metal partition structure 8 facing away from the substrate 1, the second common sub-parts 322 are disposed on opposite sides of the second metal partition structure 8 and placed in the first undercut structure 20 and the second undercut structures 80.

The first common sub-part 321 and the second common sub-parts 322 are disconnected.

As illustrated in FIG. 4, in the direction perpendicular to the substrate 1, an edge of the first common sub-part 321 close to the second undercut structure 80 is further away from the substrate 1 than an edge of the second common sub-part 322 close to the second undercut structure 80. That is, the edge of the first common sub-part 321 close to the second undercut structure 80 and the edge of the second common sub-part 322 close to the second undercut structure 80 are located on horizontal planes with different heights, and a distance between the plane where the edge of the first common sub-part 321 close to the second undercut structure 80 is located and the substrate 1 is greater than a distance between the plane where the edge of the second common sub-part 322 close to the second undercut structure 80 is located and the substrate 1.

The second cathode part 42 includes at least one first cathode sub-part 421 and second cathode sub-parts 422. The first cathode sub-part 421 and the second cathode sub-part 422 are disconnected. The first cathode sub-part 421 is provided on a surface of the first common sub-part 321, and the second cathode sub-part 422 is disposed on a surface of the second common sub-part 322 and placed in the first undercut structure 20 and/or the second undercut structure 80.

As illustrated in FIG. 4, in the direction perpendicular to the substrate 1, an edge of the first cathode sub-part 421 close to the second undercut structure 80 is further away from the substrate 1 than an edge of the second cathode sub-part 422 close to the second undercut structure 80. That is, the edge of the first cathode sub-part 421 close to the second undercut structure 80 and the edge of the second cathode sub-part 422 close to the second undercut structure 80 are located on horizontal planes with different heights, and a distance between the plane where the edge of the first cathode sub-part 421 close to the second undercut structure 80 is located and the substrate 1 is greater than a distance between the plane where the edge of the second cathode sub-part 422 close to the second undercut structure 80 is located and the substrate 1.

It should be noted that a principle of the disconnection of the first common sub-part 321 and the second common sub-part 322 at the second undercut structure 80 and a principle of the disconnection of the first cathode sub-part 421 and the second cathode sub-part 422 at the second undercut structure 80 are the same as the principle of the above-mentioned disconnection of the first common part 31 and the second common part 32 of the common layer 3, which will not be repeated here.

As illustrated in FIG. 1 and FIG. 2, an orthographic projection of the dam 7 and an orthographic projection of the second metal partition structure 8 on the substrate 1 are both closed rings. In this way, the second metal partition structure 8 may be configured to separate portions of the common layer 3 and the cathode 4 in the display area A3 from portions of the common layer 3 and the cathode 4 in the transition area A2.

In some embodiments, as illustrated in FIG. 2, the display panel includes a plurality of second metal partition structures 8. A number of the second metal partition structures 8 may be 2, 3, or more. The plurality of second metal partition structures 8 are arranged at intervals on the side of the dam 7 close to the hole area A1. Under this structure, by adding the plurality of second metal partition structures 8 in the transition area A2, the common layer 3 and the cathode 4 may be partitioned into multiple mutually disconnected parts, further reducing a risk of water vapor intruding into the display area A3 through the common layer 3.

It should be noted that the number of the second metal partition structures 8 illustrated in FIG. 2 does not represent the number of the second metal partition structures 8 in actual applications. The number of the second metal partition structures 8 may be set according to needs, and is not limited here.

In some embodiments, the display panel includes a plurality of second metal partition structures 8, at least one second metal partition structure 8 is disposed on the side of the dam 7 close to the hole area A1, and at least one second metal partition structure 8 is disposed between the dam 7 and the first metal partition structure 2.

In an embodiment, one second metal partition structure 8 is provided on the side of the dam 7 close to the hole area A1 and one second metal partition structure 8 is provided between the dam 7 and the first metal partition structure 2.

In an embodiment, six second metal partition structures 8 are provided on the side of the dam 7 close to the hole area A1, and two second metal partition structures 8 are provided between the dam 7 and the first metal partition structure 2. In practical applications, a number of the second metal partition structures 8 provided on the side of the dam 7 close to the hole area A1 and a number of the second metal partition structures 8 provided between the dam 7 and the first metal partition structure 2 may be set according to needs, and is not limited here.

In some embodiments, as illustrated in FIG. 4, the second metal partition structure 8 includes a fourth conductive layer 81, a fifth conductive layer 82, and a sixth conductive layer 83 stacked on the substrate 1. An end of the fifth conductive layer 82 close to the hole area A1 is retracted from ends of the fourth conductive layer 81 and the sixth conductive layer 83 close to the hole area A1, and the end of the fifth conductive layer 82 close to the hole area A1 is enclosed with the ends of the fourth conductive layer 81 and the sixth conductive layer 81 close to the hole area A1 to form the second undercut structure 80. An end of the fifth conductive layer 82 close to the dam 7 is retracted from ends of the fourth conductive layer 81 and the sixth conductive layer 83 close to the dam 7, and the end of the fifth conductive layer 82 close to the dam 7 is enclosed with the ends of the fourth conductive layer 81 and the sixth conductive layer 83 close to the dam 7 to form the second undercut structure 80.

In an embodiment, the fourth conductive layer 81 and the sixth conductive layer 83 are both made of titanium, and the fifth conductive layer 82 is made of aluminum.

In an embodiment, the first metal partition structure 2 and the second metal partition structure 8 are arranged on the same layer, and a film structure and material of the first metal partition structure 2 are the same as a film structure and material of the second metal partition structure 8, that is, the first metal partition structure 2 and the second metal partition structure 8 may be simultaneously manufactured in the same process.

In an embodiment, the display panel further includes a plurality of bosses 9. Some of the bosses 9 are disposed between the first metal partition structure 2 and the substrate 1, and the other some of the bosses 9 are disposed between the second metal partition structures 8 and the substrate 1. The bosses 9 may be formed and etched from inorganic insulation layers such as a buffer layer, a gate insulation layer, and an interlayer dielectric layer. By adding the bosses 9 at bottoms of the first metal partition structure 2 and the second metal partition structures 8, a segment difference between the first metal partition structure 2 and the second metal partition structure 8 may be increased, which is beneficial to disconnecting the common layer 3 and the cathode 4 at the first metal partition structure 2 and the second metal partition structures 8.

In some embodiments, the display panel further includes an encapsulation layer 10. The encapsulation layer 10 is continuously provided in the transition area A2 and the display area A3. The encapsulation layer covers the common layer 3, the cathode 4, the first metal partition structure 2, the first undercut structure 20, the second metal partition structures 8, and the second undercut structures 80.

In an embodiment, the encapsulation layer 10 is a thin film encapsulation structure. The encapsulation layer 10 includes a first inorganic encapsulation layer 101, an organic encapsulation layer 103, and a second inorganic encapsulation layer 102. The organic encapsulation layer 103 is sandwiched between the first inorganic encapsulation layer 101 and the second inorganic encapsulation layer 102. The organic encapsulation layer 102 is blocked by the dam 7 on the side of the dam 7 close to the display area A3. Both the first inorganic encapsulation layer 101 and the second inorganic encapsulation layer 102 are continuously distributed from the display area A3 to a junction of transition area A2 and hole area A1.

According to the display panels provided by the above embodiments of the present disclosure, the embodiments of the present disclosure also provide a manufacturing method of the display panel, as illustrated in FIG. 7*a* to FIG. 7*d*, which are schematic diagrams in processes of the manufacturing method of the display panel according to an embodiment of the present disclosure. The present disclosure only takes the display panel shown in FIG. 2 as an example. The manufacturing method of the display panel includes steps of S1, S2, S3, S4, and S5.

The step S1 includes: forming a first metal partition structure 2 on a substrate 1.

Figure 7A:
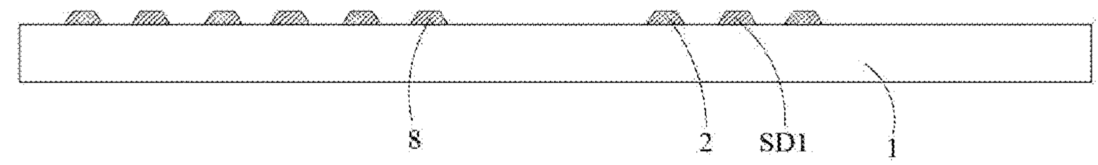
FIG. 7*a* to FIG. 7*d* are schematic diagrams in processes of a manufacturing method of a display panel according to an embodiment of the present disclosure.

As illustrated in FIG. 7*a*, the step S1 specifically includes: forming a metal layer on the substrate 1, and etching the metal layer through a dry etching process to form the first metal partition structure 2 and a plurality of second metal partition structures 8, where the second metal partition structures 8 are located on the side of the first metal partition structure 2 close to the hole area A1. The metal layer may be a source-drain electrode layer. When the display panel includes multiple source-drain electrode layers, the metal layer may be any one of the source-drain electrode layers.

The step S2 includes: forming an organic insulation layer 5 on the first metal partition structure 2.

Figure 7B:
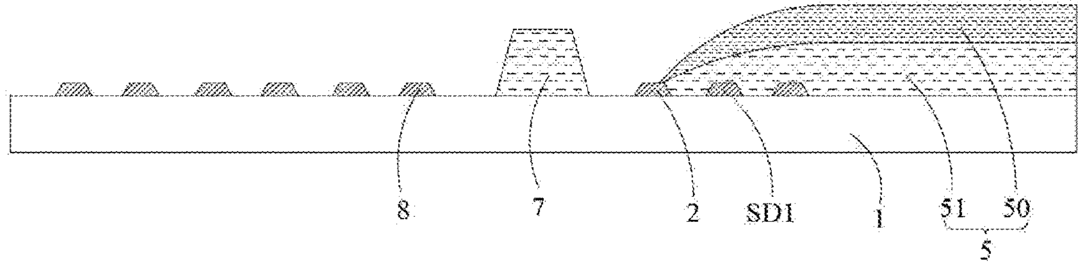

As illustrated in FIG. 7*b*, the step S2 specifically includes: depositing an organic insulating material on the substrate 1, and etching the organic insulating material through an etching process to form an organic insulation layer 5 and a dam 7, where the dam 7 is located between the first metal partition structure 2 and the second metal partition structures 8. The organic insulation layer 5 covers a side of the first metal partition structure 2 close to the display area A3 and part of a surface of the first metal partition structure 2 facing away from the substrate 1.

The step S3 includes: side etching the first metal partition structure 2 and the second metal partition structures 8 to form a first undercut structure and second undercut structures.

As illustrated in FIG. 3, FIG. 4, and FIG. 7*b*, in the step S3, the first metal partition structure 2 and the second metal partition structures 8 may be side etched through a wet etching process, and the side of the first metal partition structure 2 close to the hole area A1 is not covered by the organic insulation layer 5, so the first undercut structure is formed on the side of the first metal partition structure 2 close to the hole area A1, and the second undercut structures are formed on the side of the second metal partition structures close to the hole area A1 and the side of the second metal partition structures close to the dam 7.

The step S4 includes: forming a common layer 3 and a cathode 4 on the substrate 1.

Figure 7C:
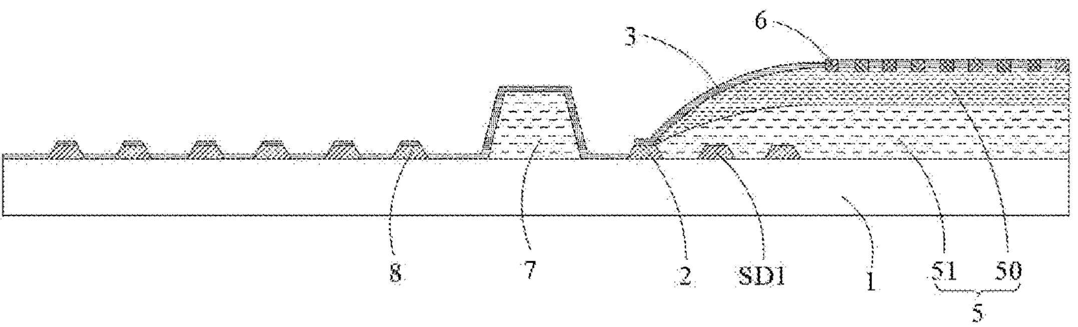

As illustrated in FIG. 7*c*, since there is a segment difference on each of the sides of the first metal partition structure 2 and the second metal partition structures 8, the common layer 3 and the cathode 4 are both disconnected on the side of the first metal partition structure 2 close to the hole area A1, the sides of the second metal partition structures 8 close to the hole area A1, and the sides of the second metal partition structures 8 close to the dam 7, thereby forming discontinuous film layers.

The step S5 includes: forming an encapsulation layer 10 on the substrate 1.

Figure 7D:
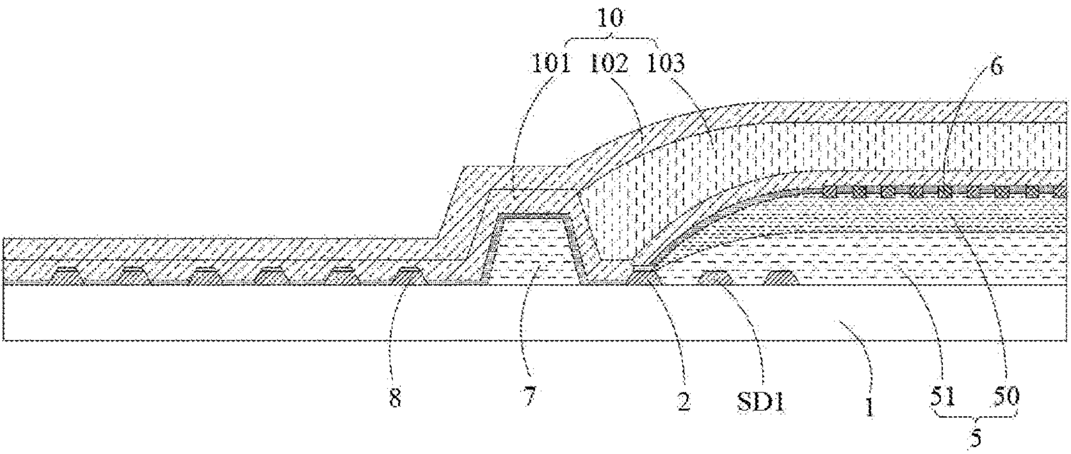

As illustrated in FIG. 7*d*, the encapsulation layer 10 is continuously provided in the transition area A2 and the display area A3. The encapsulation layer covers the common layer 3, the cathode 4, the first metal partition structure 2, the first undercut structure, the second metal partition structures 8, and the second undercut structure.

The encapsulation layer 10 is a thin film packaging structure. The encapsulation layer 10 includes a first inorganic encapsulation layer 101, an organic encapsulation layer 103, and a second inorganic encapsulation layer 102. The organic encapsulation layer 103 is sandwiched between the first inorganic encapsulation layer 101 and the second inorganic encapsulation layer 102. The organic encapsulation layer 102 is blocked by the dam 7 on the side of the dam 7 close to the display area A3. Both the first inorganic encapsulation layer 101 and the second inorganic encapsulation layer 102 are continuously distributed from the display area A3 to a junction of transition area A2 and hole area A1. The first inorganic encapsulation layer 101 and the second inorganic encapsulation layer 102 may be prepared by plasma enhanced chemical vapor deposition, and the organic encapsulation layer may be prepared by inkjet printing.

It should be noted that this embodiment only takes the first display panel illustrated in FIG. 2 as an example. The manufacturing methods of the display panel described in other embodiments are roughly the same as the above method, and will not be described again here.

According to the display panels provided in the above embodiments of the present disclosure, embodiments of the present disclosure also provide a display device. The display device includes a camera component and the display panel as provided in any one of the above embodiments. The camera component is correspondingly disposed in the hole area of the display panel. The display device may be but not limited to a smartphone, a smart watch, a desktop computer, a notebook computer, or a television.

Beneficial effects of the embodiments of the present disclosure: Embodiments of the present disclosure provide display panels and display devices. The display panel includes the substrate, the first metal partition structure, the common layer, and the cathode. The first undercut structure is recessed on the side of the first metal partition structure close to the hole area. The common layer includes the first common part and the second common part. The cathode layer includes the first cathode part and the second cathode part, and the segment difference formed by the first undercut structure may not only disconnect the first common part and the second common part, cut off the path of water vapor from intruding into the display area through the common layer, prevent water vapor from laterally intruding into the display area through the common layer, and also separate the charged first cathode part from the uncharged second cathode part close to the hole area, which prevents the electrically conductive path formed by the overlapping of the charged first cathode part and the first metal partition structure from causing electrochemical corrosion, thereby improving packaging performance and increasing the service life of the product.

In summary, although the present disclosure has been disclosed as above with preferred embodiments, the above preferred embodiments are not intended to limit the present disclosure. Those of ordinary skill in the art can make various modifications without departing from the spirit and scope of the present disclosure. Therefore, the protection scope of the present disclosure is based on the scope defined by the claims.

The invention claimed is:

1. A display panel, comprising a hole area, a transition area arranged at a periphery of the hole area, and a display area arranged at a periphery of the transition area, the display panel also comprising:

a substrate;

a dam, disposed on the substrate and located in the transition area;

a first metal partition structure, disposed on the substrate, located in the transition area, and arranged on a side of the dam away from the hole area, wherein a first undercut structure is recessed on a side of the first metal partition structure close to the dam;

a common layer, comprising a first common part and a second common part, wherein the first common part continuously extends from the display area to a surface of the first metal partition structure facing away from the substrate, the second common part extends in a direction away from the hole area, an end of the second common part away from the hole area is located in the first undercut structure, and the first common part is disconnected from the second common part; and a cathode, comprising a first cathode part and a second cathode part, wherein the first cathode part is disposed on a surface of the first common part, an end of the second cathode part is disposed in the first undercut structure and on a surface of the second common part, and the first cathode part is disconnected from the second cathode part.

2. The display panel according to claim 1, wherein the display panel further comprises a high-voltage DC power signal trace and a low-voltage DC power signal trace, the first metal partition structure is electrically connected to the high-voltage DC power signal trace, and the cathode is electrically connected to the low-voltage DC power signal trace.

3. The display panel according to claim 2, wherein the high-voltage DC power signal trace surrounds the first metal partition structure, and overlaps with a periphery of the first metal partition structure at many places.

4. The display panel according to claim 3, wherein the high-voltage DC power signal trace is grid-shaped.

5. The display panel according to claim 2, wherein the high-voltage DC power signal trace and the first metal partition structure are arranged in a same layer.

6. The display panel according to claim 1, wherein the display panel comprises an organic insulation layer that at least covers a side of the first metal partition structure close to the display area, and the first common part is partially disposed on a surface of the organic insulation layer.

7. The display panel according to claim 6, wherein the organic insulation layer covers at least part of the surface of the first metal partition structure facing away from the substrate.

8. The display panel according to claim 6, wherein the organic insulation layer comprises at least one planarization layer and a pixel definition layer disposed on the planarization layer, and at least one of the planarization layer and the pixel definition layer at least covers the side of the first metal partition structure close to the display area.

9. The display panel according to claim 8, wherein the display panel comprises a first source-drain electrode layer, the organic insulation layer comprises a first planarization layer, and the first source-drain electrode layer is disposed between the first planarization layer and the substrate; and wherein the first metal partition structure is arranged on a same layer as the first source-drain electrode layer.

10. The display panel according to claim 8, wherein the display panel comprises a first source-drain electrode layer, a first planarization layer, a second source-drain electrode layer, and a second planarization layer stacked on the substrate; and wherein the first metal partition structure is arranged on a same layer as the second source-drain electrode layer, an edge of the first planarization layer close to the hole area is located on the side of the first metal partition structure close to the display area, and at least one of the second planarization layer and the pixel definition layer at least covers the side of the first metal partition structure close to the display area.

11. The display panel according to claim 8, wherein the display panel comprises a first source-drain electrode layer, a first planarization layer, a second source-drain electrode layer, a second planarization layer, a third source-drain electrode layer, and a third planarization layer stacked on the substrate; and wherein the first metal partition structure is arranged on a same layer as the third source-drain electrode layer, an edge of the first planarization layer and an edge of the second planarization layer close to the hole area are both located on the side of the first metal partition structure close to the display area, and at least one of the third planarization layer and the pixel definition layer at least covers the side of the first metal partition structure close to the display area.

12. The display panel according to claim 1, wherein in a direction perpendicular to the substrate, an edge of the first common part close to the first undercut structure is further away from the substrate than an edge of the second common part close to the first undercut structure, and an edge of the first cathode part close to the first undercut structure is further away from the substrate than an edge of the second cathode part close to the first undercut structure.

13. The display panel according to claim 1, wherein the first metal partition structure comprises a first conductive layer, a second conductive layer, and a third conductive layer stacked on the substrate, an end of the second conductive layer close to the hole area is retracted from ends of the first conductive layer and the third conductive layer close to the hole area, and the end of the second conductive layer close to the hole area is enclosed with the ends of the first conductive layer and the third conductive layer close to the hole area to form the first undercut structure.

14. The display panel according to claim 13, wherein the second common part is in contact with the first conductive layer, the end of the second common part located in the first undercut structure is disconnected from the second conductive layer, the second cathode part is in contact with the first conductive layer, and the end of the second cathode part located in the first undercut structure is disconnected from the second conductive layer.

15. The display panel according to claim 1, wherein the display panel further comprises:

a second metal partition structure, disposed on the substrate, disposed on a side of the dam close to the hole area, and surrounding the hole area;

at least one of a side of the second metal partition structure close to the hole area and a side of the second metal partition structure close to the dam is recessed to form a second undercut structure, the second common part comprises a first common sub-part and second common sub-parts, the first common sub-part is disposed on a surface of the second metal partition structure facing away from the substrate, the second common sub-parts are disposed on opposite sides of the second metal partition structure and placed in the first undercut structure and the second undercut structure, and the first common sub-part and the second common sub-parts are disconnected; and the second cathode part comprises a first cathode sub-part and second cathode sub-parts, the first cathode sub-part is disposed on a surface of the first common sub-part, the second cathode sub-parts are disposed on surfaces of the second common sub-parts, ends of the second cathode sub-parts are disposed in the first undercut structure and the second undercut structure, and the first cathode sub-part and the second cathode sub-parts are disconnected.

16. The display panel according to claim 15, wherein the second metal partition structure comprises a fourth conductive layer, a fifth conductive layer, and a sixth conductive layer stacked on the substrate, an end of the fifth conductive layer close to the hole area is retracted from ends of the fourth conductive layer and the sixth conductive layer close to the hole area, and the end of the fifth conductive layer close to the hole area is enclosed with the ends of the fourth conductive layer and the sixth conductive layer close to the hole area to form the second undercut structure; and/or an end of the fifth conductive layer close to the dam is retracted from ends of the fourth conductive layer and the sixth conductive layer close to the dam, and the end of the fifth conductive layer close to the dam is enclosed with the ends of the fourth conductive layer and the sixth conductive layer close to the dam to form the second undercut structure.

17. The display panel according to claim 15, wherein the display panel further comprises a plurality of bosses, some of the bosses are disposed between the first metal partition structure and the substrate, and the other some of the bosses are disposed between the second metal partition structure and the substrate.

18. The display panel according to claim 15, wherein the display panel further comprises an encapsulation layer, the encapsulation layer is continuously provided in the transition area and the display area, the encapsulation layer covers the common layer, the cathode, the first metal partition structure, the first undercut structure, the second metal partition structure, and the second undercut structure.

19. The display panel according to claim 1, wherein the common layer comprises a hole injection layer, a hole transport layer, an electron transport layer, and an electron injection layer, which are stacked.

20. A display device, comprising a display panel, the display panel comprising a hole area, a transition area arranged at a periphery of the hole area, and a display area arranged at a periphery of the transition area, the display panel also comprising:

a substrate;

a dam, disposed on the substrate and located in the transition area;

a first metal partition structure, disposed on the substrate, located in the transition area, and arranged on a side of the dam away from the hole area, wherein a first undercut structure is recessed on a side of the first metal partition structure close to the dam;

a common layer, comprising a first common part and a second common part, wherein the first common part continuously extends from the display area to an upper surface of the first metal partition structure facing away from the substrate, the second common part extends in a direction away from the hole area, an end of the second common part away from the hole area is located in the first undercut structure, and the first common part is disconnected from the second common part; and a cathode, comprising a first cathode part and a second cathode part, wherein the first cathode part is disposed on a surface of the first common part, an end of the second cathode part is disposed in the first undercut structure and on a surface of the second common part, and the first cathode part is disconnected from the second cathode part.

* * * * *